US006973635B2

(12) United States Patent
Happoya

(10) Patent No.: US 6,973,635 B2
(45) Date of Patent: Dec. 6, 2005

(54) PRINTED WIRING BOARD DESIGN AIDING SYSTEM, PRINTED WIRING BOARD CAD SYSTEM, AND RECORD MEDIUM

(75) Inventor: Akihiko Happoya, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 10/624,491

(22) Filed: Jul. 23, 2003

(65) Prior Publication Data

US 2004/0128278 A1 Jul. 1, 2004

(30) Foreign Application Priority Data

Jul. 30, 2002 (JP) ............................ 2002-221828

(51) Int. Cl.[7] ............................................ G06F 17/50

(52) U.S. Cl. .................. 716/19; 716/1; 716/5; 716/11; 438/676; 703/14

(58) Field of Search ........................... 716/1, 5, 11, 19; 438/676; 703/14

(56) References Cited

U.S. PATENT DOCUMENTS 6,753,253 B1 * 6/2004 Takahashi et al. .......... 438/676

FOREIGN PATENT DOCUMENTS

JP 2001-273350 A 10/2001

OTHER PUBLICATIONS

Notification of Reasons for Rejection (Office Action) for Japanese Patent Application No. 2002-221828, mailed Aug. 23, 2005 and English translation thereof.

* cited by examiner

*Primary Examiner*—Thuan Do
(74) *Attorney, Agent, or Firm*—Finnegan, Henderson, Farabow, Garrett & Dunner, L.L.P.

(57) ABSTRACT

A printed wiring board design aiding system comprises a first unit which acquires design layout information regarding a printed wiring board targeted for design, a second unit which acquires setting parameter information for the printed wiring board, which is targeted for design, and a third unit which estimates a value of the thickness of each of insulation layers of the printed wiring board in a post-manufacture state in accordance with the information acquired by the first unit and the information acquired by the second unit, and for outputting an estimated value.

11 Claims, 3 Drawing Sheets

PRINTED WIRING BOARD DESIGN AIDING SYSTEM, PRINTED WIRING BOARD CAD SYSTEM, AND RECORD MEDIUM

CROSS-REFERENCE TO RELATED APPLICATIONS

This application is based upon and claims the benefit of priority from the prior Japanese Patent Application No. 2002-221828, filed Jul. 30, 2002, the entire contents of which are incorporated herein by reference.

BACKGROUND OF THE INVENTION

1. Field of the Invention

The invention relates to a printed wiring board design aiding system, a printed wiring board CAD (computer aided design) system, and a record medium having stored thereon a computer readable program for enabling a computer for causing a printed wiring board CAD processor to aid a printed wiring board design 2. Description of the Related Art A printed wiring board CAD is known as a tool for designing printed wiring boards. As data for the printed wiring board CAD data, various types of design information of, for example, patterns, through-holes, non-through-holes, vias, printed wiring board shapes are used. Besides the printed wiring board CAD, a CAE (computer aided engineering) is used to perform transmission line simulation by using CAD data.

In general practices, independently of CAD and CAE, work can take place that requires values of the plate thickness of a printed wiring board to be designed, the thickness of individual insulation layers thereof, and permittivities and dielectric loss tangents of the individual layers. In this case, the work is done without linking to CAD or CAE for the printed wiring board. As such, the work needs to be done in the stage of designing the printed wiring board in such a manner that the necessary values are discreetly obtained through calculations, and past referential data is used each time the need arises.

Problems as described below arise in the case of obtaining the thickness of the printed wiring board, the thicknesses of individual insulation layers, and permittivities and dielectric loss tangents of individual layers in the design stage of a printed wiring board.

(1) Thickness of Each Insulation Layer of Printed Wiring Board

A description will be provided with reference to an example of a printed wiring board with four-layer-passing through-holes. A general printed wiring board formed of four layers (L1 to L4) is formed through stacking processes. Specifically, individual prepregs between layers 1 and 2 (L1 and L2) and between layers 1 and 2 (L3 and L4) and individual copper foils of the layer L1 and the layer L4 are adhered onto a double-sided copper-clad laminate plate (core member) placed between the layers 2 and 3 (L2 and L3). Thereafter, through-hole forming openings are individually drilled in the laminate plate, and through-hole plating is applied. In this manner, individual four-layer-passing through-holes are formed.

In this case, the double-sided copper-clad laminate plate between the layers 2 and 3 is manufactured by a printed-wiring-board material manufacturer. As such, since factors causing variations to the thickness of the insulation layer of the double-sided copper-clad laminate plate are few, the thickness accuracy is high. However, the thicknesses of the insulation layers between the layers 1 and 2 and between the layers 3 and 4 are dependent on the manufacturing steps carried out by a printed-wiring-board manufacturer. More specifically, the thicknesses are determined depending on many parameters. The parameters include those representing, for example, residual-copper ratios the layers L2 and L3, pattern thicknesses of the layer L2 and L3, pattern shapes of the layers L2 and L3, resin contents of the prepregs, and the viscosities of the prepregs, resin flow amounts of the prepregs, stack conditions (stack times, temperatures, and pressures). Thus, the large number of parameters are involved that affect the thicknesses of the insulation layers between the layers 1 and 2 and between the layers 3 and 4. This makes it difficult to obtain the thicknesses through trivial calculations, and can cause deviations between measured values and trivially calculated values.

In addition, the thickness of each of the insulation layers of one printed wiring board is variable in distribution over one plane depending on the shape and the place of the pattern. Generally, it is known that an outside portion of a working panel used in the stacking process tends to be thin.

Depending on the case, the thicknesses of the insulation layers of the printed wiring board are each used for transmission line simulation. Printed wiring boards are each designed to be different depending on the types thereof, and each of the insulation layers thereof is variable depending on the parameters described above. As such, precise values cannot be obtained through trivial calculations. With values trivially obtained, a case can occurs in which thickness values used for the transmission line simulation deviate from actually measured values, in which the accuracy of the solution itself produced in the transmission line simulation is consequently low.

(2) Plate Thickness of Printed Wiring Board

Suppose a deviation occurs between a calculated value and a measured value of the thickness of each of the insulation layers of the printed wiring board. In this case, a deviation occurs between a calculated value and a measured value of the plate thickness of the printed wiring board, as a matter of course. A large deviation between the calculated value and the measured value of the plate thickness is large leads to problems as described hereunder. For example, a case assumed in which the printed wiring board is mounted in a product such as a notebook personal computer, which is to be fabricated to include the printed wiring board. In this case, since the thickness of the printed wiring board deviates from the design value, a problem occurs in that the position of a connector mounted on the printed wiring board does not match a connector position of a housing of the computer. By way of another example, when mounting surface-mounting type devices over the printed wiring board, solder paste is printed. In this case, when the thickness of the printed wiring board deviates from a design value, the amount of the print-applied solder paste deviates from an estimated amount. Consequently, a problem occurs in that soldering quality is not steady or consistent.

(3) Permittivities and Dielectric Loss Tangents

No problems occur if the interlayer materials are of one type. Generally, however, a printed wiring board is formed of composite materials including two or more different materials. For example, a generally used material is glass epoxy composed of a mixture of glass cloth and epoxy resin. The permittivity and the dielectric loss tangent of the composite material are variable depending on the contents of the individual materials containing therein. When the prepreg is such a composite material, the permittivity and the dielectric loss tangent before stacking (in a pre-stacking state) are different from those after stacking (in a post-stacking state). Although the prepreg is in the state of the composite material having a certain content before stacking, since, for example, the resin is caused to flow filling non-patterned portions in the stacking process, the content of the composite material is varied. Specifically, in the pre-stacking state, the glass epoxy has, for example, a resin content of 60% and a permittivity of 4.3. In comparison, since the resin flows after stacking, the average resin content is changed to 53%, and the permittivity is changed to 4.5 in the post-stacking state. Even in the case of one of the insulation layers of the printed wiring board, the permittivity and dielectric loss tangent thereof in a plane are individually different depending on, for example, the shape and the position of the pattern. Further problems can arise as described hereunder. With reference to FIG. 5, which will be referred to in a detailed description below, between L1 and L2 is formed a glass epoxy prepreg. When the stacking process for the printed wiring board is performed by a printed-wiring-board manufacturer, the prepreg between L1 and L2 is melted by heat and pressure, and is then solidified. The glass epoxy prepreg is a mixture of glass cloth and epoxy resin, and the melted prepreg fills portions where the pattern L2 is not present. Although between L1 and L2 is formed the glass epoxy mixture, since the glass cloth does not flow, lateral portions of the pattern L2 (where the pattern is not present) remain to be of only the epoxy resin. For example, the glass epoxy has a resin content of 60% and a permittivity of 4.3 in the pre-stacking state. After stacking, however, in the portion of the glass epoxy mixture between L1 and L2, the resin content is changed to 53%, and the permittivity is changed to 4.5. Concurrently, in the lateral portions of the pattern L2 (where the pattern is not present), since the portion is of only the epoxy resin, the resin content is 100% and the permittivity is 3.0. Depending on the case, values of the permittivity and the dielectric loss tangent are used for transmission line simulation of a printed wiring board. Generally, pre-stacking values provided by a material manufacturer are used, but there are almost no cases where post-stacking values are used. This is because, similar to the thickness of each of the insulation layer of the printed wiring board, it is difficult to easily obtain the post-stacking value for the reason that the value is influenced by many parameters. The parameters include those representing residual-copper ratios of patterns, pattern thicknesses, pattern shapes, resin contents of prepregs, viscosities of the prepregs, resin flow amounts of the prepregs, and stack conditions (stack times, temperatures, and pressures). Thus, a deviation can occur with the value itself that is used for transmission line simulation, therefore reducing the accuracy of a solution itself produced in the transmission line simulation.

As described above, conventionally, suppose a printed wiring board, values of, for example, the plate thickness of the printed wiring board, the thicknesses of individual insulation layers, and the permittivities and dielectric loss tangents of individual layers are discreetly obtained. In addition, the values are obtained by, for example, performing calculations and using past referential data upon necessity during the design of each of the printed wiring boards. As such, deviations take place between the individual calculated values and measured values, thereby causing deficiencies in dimensions and electrical characteristics. This leads to problems of requiring much time and labor to obtain a desired product in the manufacture of a printed wiring board for which high mechanical and electrical accuracies are required.

BRIEF SUMMARY OF THE INVENTION

According to one aspect of the invention, there are provided a printed wiring board design aiding system and a record medium having stored thereon a computer readable program for enabling a computer for causing a printed wiring board CAD (computer aided design) processor to aid a printed wiring board design. The system and program bring calculated values in the stage of designing the printed wiring board to be as close to measured values as possible, thereby enabling improvement of design accuracy of the printed wiring board for which high mechanical and electrical accuracies are required.

An embodiment of the invention is disclosed herein. The embodiment realizes functions of estimating values of a plate thickness of a printed wiring board and the thicknesses of individual insulation layers thereof. The functions estimate these values by using CAD data (two-dimensional data of, for example, patterns, through-holes, vias, and wiring-board shapes) provided for designing a printed wiring board. Concurrently, the functions estimate the values in consideration of design and manufacture parameters representing, for example, residual-copper ratios of patterns, thicknesses of the patterns, the shapes of the patterns, the resin contents of the individual insulation layers, the viscosities of the individual insulation layers, resin flow amounts of the individual insulation layers, and stack conditions (stack times, temperatures, and pressures). Using the above-described estimated values, the functions further estimate values of permittivities, dielectric loss tangents, and the like of the individual insulation layers, and presents the estimation results.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the invention will be described hereinbelow with reference to the drawings.

Figure 1:
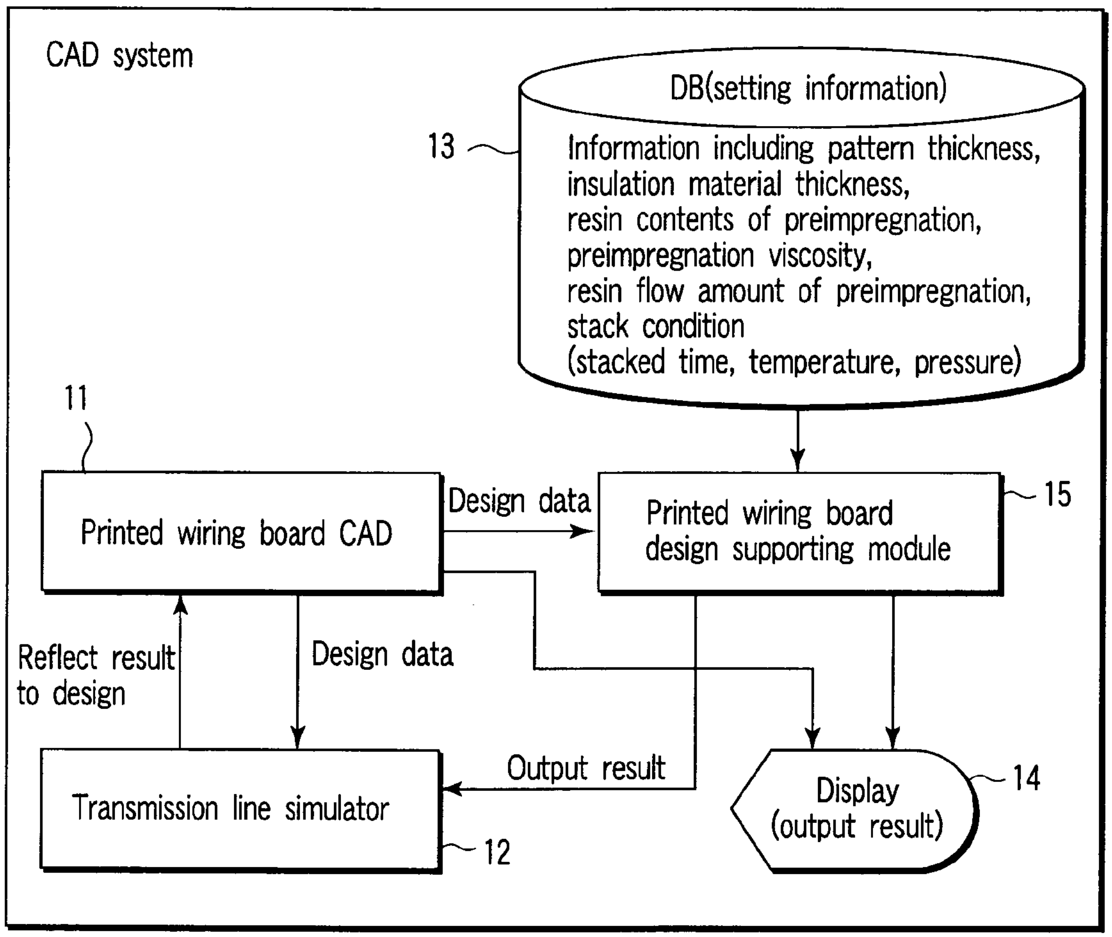
FIG. 1 is a block diagram showing a configuration of a printed wiring board CAD system according to an embodiment of the invention.

FIG. 1 is a block diagram showing a configuration of a printed wiring board CAD system according to an embodiment of the invention. The printed wiring board CAD system according to the embodiment of the invention includes a printed wiring board CAD processor 11, a display section 14, and a transmission line simulator 12. The printed wiring board CAD system of the embodiment further includes a database 13 and a printed wiring board design aiding module 15. The database 13 stores therein various parameters regarding printed wiring boards, which are design objectives. In accordance with data acquired from the printed wiring board CAD processor 11 and the database 13, the printed wiring board design aiding module 15 estimates and outputs post-manufacture data, such as the plate thickness of the printed wiring board, the thicknesses of individual insulation layers thereof, and the permittivities and dielectric loss tangents of individual layers thereof.

In more specific, the database 13 contains parameters that influence the plate thickness and individual layers of the printed wiring board that is to be designed. The parameters include those representing pattern thicknesses, insulation material thicknesses, resin contents of prepregs, viscosities of prepregs, resin flow amounts of the prepregs, and stack conditions (stack times, temperatures, and pressures).

The printed wiring board design aiding module 15 acquires two-dimensional (plane-based) design information for the printed wiring board, which is to be designed, from the printed wiring board CAD processor 11. In addition, from the database 13, the module 15 acquires the parameter information, which influences the plate thickness of the printed wiring board, which is to be designed, and the thicknesses of the individual layers thereof. More specifically, from CAD processor 11, the module 15 acquires individual design layout information of, for example, patterns, through-holes, non-through-holes, vias, wiring board shapes. From the database 13, the module 15 acquires the parameters representing, for example, the pattern thicknesses, pattern shapes, resin contents of the prepregs, the viscosities of the prepregs, resin flow amounts of the prepregs, and stack conditions (stack times, temperatures, and pressures).

Further, the printed wiring board design aiding module 15 estimates the post-manufacture values of plate thickness of the printed wiring board and the thicknesses of the individual insulation layers. The values are estimated in accordance with the design layout information acquired from the printed wiring board CAD processor 11 and the parameters acquired from the database 13. Furthermore, using these estimated values, the module 15 estimates the permittivities and dielectric loss tangents of the individual layers when necessary. Then, the module 15 displays the estimated values on the display section 14, and performs feedback of the estimated values to the transmission line simulator 12.

Figure 2:
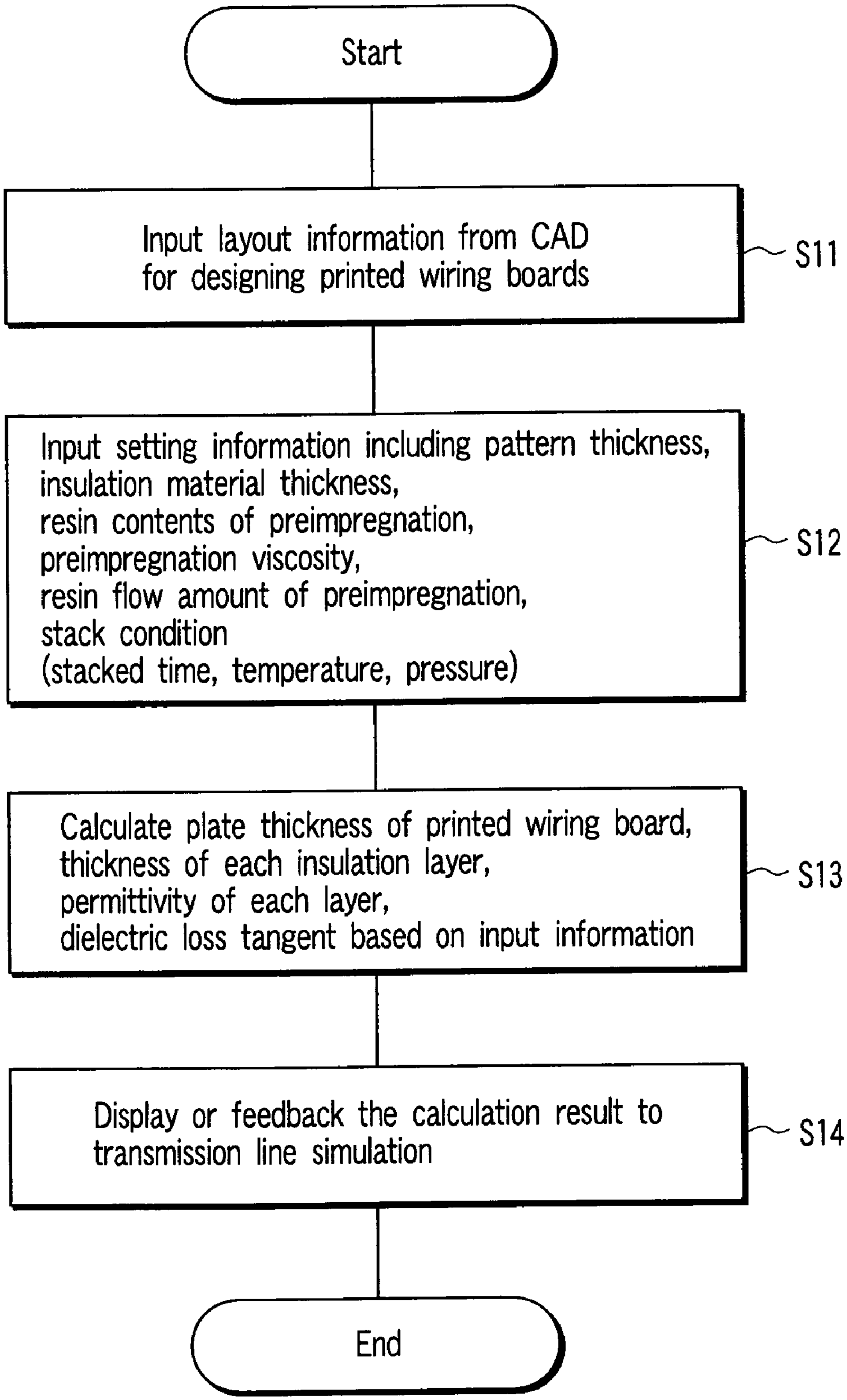
FIG. 2 is a flowchart of processing procedures to be carried out by a printed wiring board design aiding module according to the embodiment of the invention.

FIG. 2 is a flowchart of processing procedures to be carried out by the printed wiring board design aiding module 15.

Figure 3:
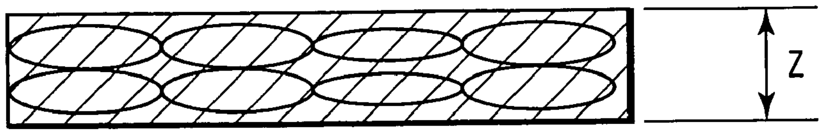
FIG. 3 is a cross-sectional view of a prepreg, for explaining variations in the thickness of an insulation layer according to the embodiment of the invention.
Figure 4:
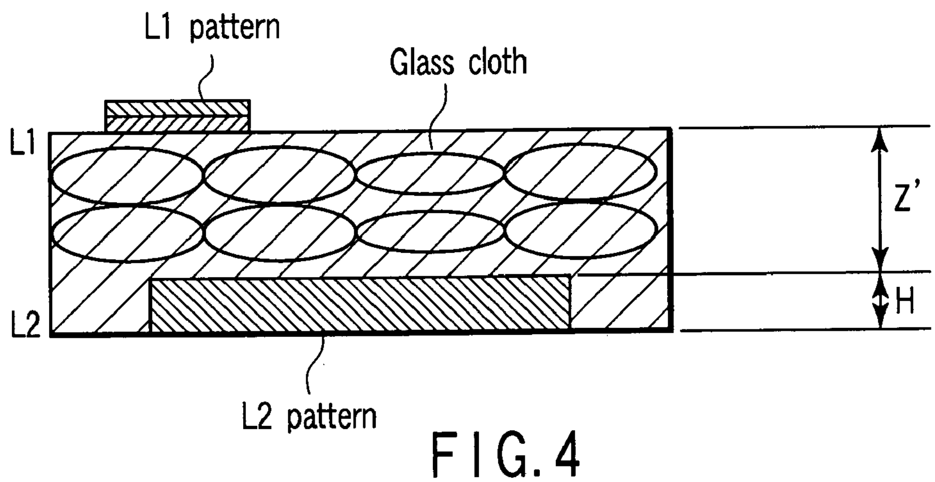
FIG. 4 is a cross-sectional view of a prepreg, for explaining variations in the thickness of the insulation layer according to the embodiment of the invention.
Figure 5:
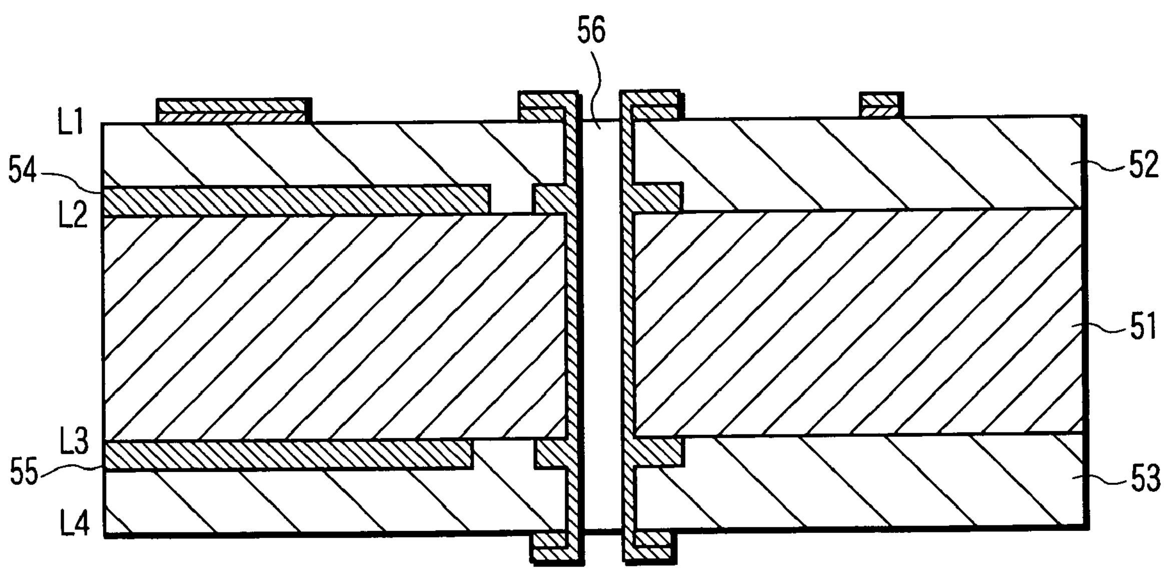
FIG. 5 is a view showing an example cross-sectional configuration of the printed wiring board, which is a design objective, to which the invention is applied.

FIGS. 3 and 4 are cross-sectional views of a prepreg, are used to explain processing executed in step S13 of the flowchart shown in FIG. 2, and depict extracted portions of a printed wiring board shown in FIG. 5. FIG. 3 is a cross-sectional view of the prepreg in a pre-stacking state, and FIG. 4 is a cross-sectional view of the prepreg in post-stacking state.

FIG. 5 is a view showing a cross-sectional configuration of a four-layer-passing-through-hole printed wiring board as an objective to which the invention is applied. A general four-layer (L1 to L4) printed wiring board is formed by stacking processing. Specifically, individual prepregs 52 and 53 between layers 1 and 2 (L1 and L2) layers and between layers 1 and 2 (L3 and L4) layers and individual copper foils 54 and 55 of the layer L1 and the layer L4 are adhered onto a double-sided copper-clad laminate plate 51 (core member) between the layers 2 and 3 (L2 and L3). Thereafter, a through-hole forming opening is drilled in the laminate plate, and through-hole plating is applied. Thereby, a four-layer-passing through-hole 56 is formed.

Processes according to the embodiment of the invention will now be described hereinbelow with reference to the individual drawings.

As shown in FIG. 1, the printed wiring board CAD system according to the embodiment of the invention is configured such that the database 13 and the printed wiring board design aiding module 15 are added to the system including the printed wiring board CAD processor 11, the display section 14, and the transmission line simulator 12. The database 13 stores therein various parameters regarding printed wiring board circuit boards that are to be designed. In accordance with data acquired from the printed wiring board CAD processor 11 and the database 13, the printed wiring board design aiding module 15 estimates post-manufacture data, such as the plate thickness of the printed wiring board, the thicknesses of individual insulation layers thereof, and the permittivities and dielectric loss tangents of individual layers thereof. More specifically, the database 13 store therein parameters that influence the plate thickness and the thicknesses of individual layers of the printed wiring boards that are to be designed. The parameters include those representing pattern thicknesses, insulation material thicknesses, resin contents of prepregs, viscosities of the prepregs, resin flow amounts of the prepregs, and stack conditions (stack times, temperatures, and pressures).

The printed wiring board design aiding module 115 acquires individual design layout information of, for example, patterns, through-holes, non-through-holes, vias, printed wiring board shapes (step S11 shown in FIG. 2), from CAD processor 11. In addition, the module 15 acquires the parameters representing, for example, pattern thicknesses, pattern shapes, resin content of the prepregs, viscosities of the prepregs, resin flow amounts of the prepregs, and stack conditions (stack times, temperatures, and pressures), from the database 13 (step S12 shown in FIG. 2).

Further, the printed wiring board design aiding module 15 performs estimation of various values (step S13 shown in FIG. 2). Specifically, the module 15 estimates values of the post-manufacture plate thickness of the printed wiring board and the thicknesses of the individual insulation layers in accordance with the design layout information acquired from the printed wiring board CAD processor 11 and the parameters acquired from the database 13. In addition, using the estimated values described above, the module 15 estimates the values of permittivities and dielectric loss tangents of the individual layers when necessary. Then, the module 15 displays the estimated values on the display section 14, and performs feedback of the estimated values to the transmission line simulator 12 (step S14 shown in FIG. 2).

The process (step S13 shown in FIG. 2) will be described in more detail. The printed wiring board design aiding module 15 estimates the post-manufacture plate thickness of the printed wiring board and the thicknesses of the individual layers thereof in a manner described below.

The printed wiring board design aiding module 15 obtains values of the plate thickness of the printed wiring board to be manufactured and thicknesses of individual insulation layers. In addition, the module 15 obtains values of the permittivities and dielectric loss tangents of the individual layers when necessary. These values are obtained using design data acquired from the printed wiring board CAD processor 11 and the design and manufacture parameters stored in the database 13.

(I) Method of Obtaining Plate Thickness of Printed Wiring Board and Thicknesses of Individual Layers The method obtains the plate thickness of the printed wiring board and the thicknesses of the individual layers in consideration of CAD data regarding on the printed wiring board and manufacturability of the printed wiring board.

For example, with reference to FIG. 5, the double-sided copper-clad laminate plate 51 (core member) between the layers 2 and 3 (L2 and L3) is manufactured by a printed-wiring-board material manufacturer. As such, factors causing variations in the thickness the insulation layer of the double-sided copper-clad laminate plate are few. Hence, since the thickness accuracy is high, thickness data provided by the printed-wiring-board material manufacturer may be used. The printed wiring board design aiding module 15 offers a feature in that while the insulation layers between the layers 1 and 2 and the layers 3 and 4 are manufactured by a printed-wiring-board manufacturer and the number of potential variation factors causing variations in the thicknesses of the insulation layers is large, the thicknesses can be obtained with high accuracy. The variation factors determining the insulation layers between the layers 1 and 2 and the layers 3 and 4 include:

- Residual-copper ratio of the layer, such as the layer L2 or L3;
- Pattern thicknesses of the layer, such as the layer L2 or L3;
- Pattern shape of the layer, such as the layer L2 or L3;
- Resin content of the prepreg (content of a composite material of two or more materials);
- Viscosity of the prepreg;
- Resin flow amount of the prepreg;
- Stack conditions (stack time, temperature, and pressure);
- Quantity, shape, and position of the through-hole, non-through-hole, or via; and
- Shape of the printed wiring board.

With these variation factors being added to CAD data, the plate thickness of printed wiring board to be designed and the thicknesses of the individual insulation layers can be obtained. An essential feature is that the plate thickness of the printed wiring board and the thicknesses of the individual layers that conform to design information, such as the residual-copper ratios of individual conductors and the shapes of the patterns of the individual conductors, through-holes, non-through-holes, vias, and the printed wiring board, are obtained through linkage with the printed wiring board CAD processor 11. The thickness of each insulation layer of one printed wiring board is variable in distribution within one plane depending on the shape of the pattern and the position. However, linking with the printed wiring board CAD processor, the distributed in-plane thicknesses can be obtained.

In general, the printed wiring board CAD processor 11 and the transmission line simulator 12 are linked together. According to the embodiment of the invention, transmission line simulation is carried out using the resultant plate thickness (thickness distribution) of the printed wiring board and the resultant thicknesses of the individual insulation layers, the thicknesses having been obtained by the printed wiring board design aiding module 15. Consequently, the transmission line simulation can be implemented with high accuracy.

The thickness of the insulation layer will further be described hereinbelow.

The pre-stacking insulation layer thickness is related to the post-stacking insulation layer thickness as described hereunder.

(1) Pre-Stacking Insulation Layer Thickness

A printed wiring board using an ordinary glass epoxy resin includes a core (CCL) and a prepreg.

A printed-wiring-board manufacturer procures the core in a cured or solidified state (C stage), in which stacking does not vary the thickness of the core. However, since the manufacturer procures the prepreg in a semi-solidified state, stacking varies the thickness of the prepreg.

A cross section of a prepreg before being stacked pre-stacking prepreg is shown in FIG. 3.

The thickness of the pre-stacking prepreg is similar in shape to the thickness of a sheet and is in a state where resin and glass cloth are mixed together at constant ratios of contents. Reference characters A and B represent the volume percentage of the resin and the volume percentage of the glass cloth, respectively, with their relationship (A+B=1). When the area of the prepreg is represented by reference character S and the thickness thereof is represented by reference character Z, the resin content is expressed by Equation (1) shown below.

$$\text{Resin Content}=S\times Z\times A \tag{1}$$

(2) Post-Stacking Insulation Layer Thickness

A cross section of the prepreg after being stacked (post-stacking prepreg) is shown in FIG. 4. More specifically, FIG. 4 is an enlarged view of the first layer (L1) and the second layer (L2) of the printed wiring board shown in FIG. 5.

After the prepreg is processed in the stacking step, the thickness of the prepreg is changed from Z to Z'. Portions where the pattern L2 is not formed are filled with the flowing resin.

The resin content is expressed by Equation (2) shown below, where factors in FIG. 4 are represented as: C=residual-copper ratio of the pattern L2; H=thickness of the pattern L2; D=resin flow amount (overflow amount) at the time of stacking, and A'=percentage by volume of resin in Z' area.

$$\text{Resin Content}=S\times Z'\times A+(1-C)\times H\times S+D \tag{2}$$

Since the pre-stacking resin content is the same as the post-stacking resin content (Equation (3)), the relationship Equation (1)=Equation (2) is established, and the post-stacking thickness Z' becomes as expressed by Equation (4).

$$S\times Z\times A=S\times Z'\times A'+(1-C)\times H\times S+D \tag{3}$$

$$Z'=(Z-(1-C)\times H-D/S)/A' \tag{4}$$

The resin flow amount D in Equation (4) is a function as represented by a parameter shown in Equation (5).

$$D=f\text{ (prepreg viscosity, stack conditions (stack time, temperature, and pressure))} \tag{5}$$

(II) Method of Obtaining Permittivities and Dielectric Loss Tangents of Individual Layers Basically, a method of obtaining the permittivities and the dielectric loss tangents is based on the same concept as that for the method of obtaining the plate thickness of the printed wiring board and the thicknesses of the individual layers. The printed wiring board design aiding module 15 obtains the permittivity and dielectric loss tangent of the insulation layer of the printed wiring board in consideration of CAD data regarding the printed wiring board and manufacturability of the printed wiring board. In a case where the material of each of the insulation layers is a compound of two or more materials, the permittivity and the dielectric loss tangent are variable depending on the content of each of the composite materials. Even in the case one of the insulation layers, the permittivity and the dielectric loss tangent thereof in a plane are individually different depending on, for example, the shape and the position of the pattern.

By way of example, with reference to FIG. 5, the double-sided copper-clad laminate plate 51 between the layers 2 and 3 (L2 and L3) is manufactured by a printed-wiring-board material manufacturer. As such, factors for varying the permittivity and the dielectric loss tangent of the double-sided copper-clad laminate plate are few. Hence, since the accuracy of the permittivity and the dielectric loss tangent thereof is high, data provided by the printed-wiring-board material manufacturer may be used. The printed wiring board design aiding module 15 offers a feature in that while the insulation layers between the layers 1 and 2 and the layers 3 and 4 are manufactured by a printed-wiring-board manufacturer and factors of causing variations are many, the permittivity and the dielectric loss tangent of the insulation layers between the layers 1 and 2 and the layers 3 and 4 can be obtained with high accuracy. The variation factors determining the permittivity and the dielectric loss tangent of the insulation layers between the layers 1 and 2 and the layers 3 and 4 are the same as those that determine the thicknesses.

The printed wiring board design aiding module 15 is capable of calculating variation factors and obtaining the permittivities and the dielectric loss tangents of the printed wiring board to be designed. An essential feature is that the permittivities and dielectric loss tangents of the individual insulation layers that conform to design information, such as the residual-copper ratios of individual conductors and the shapes of the patterns of the individual conductors, through-holes, non-through-holes, vias, and the printed wiring board, are obtained through linkage with the printed wiring board CAD processor 11. The permittivities and dielectric loss tangents of the insulation layers of the printed wiring board to be designed are variable in distribution within one plane depending on the shape of pattern and the position. Nevertheless, however, since linking is made with the printed wiring board CAD processor, distribution of in-plane the permittivity and the dielectric loss tangent of the insulating layers can be obtained.

In general, the printed wiring board CAD processor 11 and the transmission line simulator 12 are linked together. Transmission line simulation is carried out using the resultant of the permittivities and dielectric loss tangents of the insulation layers of the printed wiring board, which have been obtained by the printed wiring board design aiding module 15. Consequently, the transmission line simulation can be implemented with high accuracy.

The permittivity will further be described hereinbelow.

(1) Pre-stacking Permittivities

Ordinary, glass cloth has a permittivity of 7.0, and an epoxy base resin has a permittivity of 3.6.

Reference characters A and B represent the volume percentage of the resin and the volume percentage of the glass cloth, respectively. The permittivity of the resin is represented by $\epsilon_{resin}$, the permittivity of the glass cloth is represented by $\epsilon_{glass}$, and the permittivity of the pre-stacking glass epoxy is represented by $\epsilon_{before}$. These variables have the relationship as expressed by Equation (6) shown below.

$$\mathrm{Log}\epsilon_{before} = A\,\mathrm{Log}\epsilon_{resin} + B\,\mathrm{Log}\epsilon_{glass} \qquad (6)$$

(2) Post-stacking Permittivities

Reference characters A' and B' represent the volume percentage of the post-stacking resin and the volume percentage of the post-stacking glass cloth, respectively. The volume percentage of the post-stacking resin of the area Z' shown in FIG. 4 is represented by A', and the volume percentage of the post-stacking glass cloth thereof is represented by B'. The permittivity of the post-stacking glass cloth is represented by $\epsilon_{after}$. These variables have the relationship as expressed by Equation (7) shown below.

$$\mathrm{Log}\epsilon_{after} = A'\mathrm{Log}\epsilon_{resin} + B'\mathrm{Log}\epsilon_{glass} \qquad (7)$$

As described above, using CAD data for designing the printed wiring board and the design and manufacture parameters relative to the printed wiring board, the printed wiring board design aiding module 15 is used to obtain the plate thickness of the printed wiring board and the thicknesses of the individual insulation layers thereof. In addition, as the necessity arises, the module 15 is used to obtain the permittivities and dielectric loss tangents of the individual layers. This enables the individual items of information even closer to an actually manufactured printed wiring, such as the plate thickness of the printed wiring board, the thicknesses of the individual insulation layers, and the permittivities and dielectric loss tangents of the individual layers, to be obtained. In addition, these items of information are displayed on the display section 14, and are fed back to the transmission line simulator 12. Therefore, accuracy with respect to, particularly, the individual layers of the printed wiring board and in the direction to the overall thickness thereof can be improved even higher.

Accordingly, calculated values in the stage of designing the printed wiring board can be brought closer to measured values. Consequently, improvement can be achieved in the design accuracy of printed wiring boards for which high mechanical and electrical accuracies are required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A printed wiring board design aiding system comprising:

a printed wiring board design aiding module, including means for acquiring design layout information regarding a printed wiring board targeted for design;

means for acquiring setting parameter information for the printed wiring board, which is targeted for design; and means for estimating a value of the thickness of each of insulation layers of the printed wiring board in a post-manufacture state in accordance with the information acquired by the means for acquiring design layout information and the information acquired by the means for acquiring setting parameter information, and for outputting an estimated value.

2. The printed wiring board design aiding system according to claim 1, further comprising means for performing feedback of information of a plate thickness or the thickness of each of the insulation layers, which have been estimated by the means for estimating a value of the thickness of each of insulation layers, to a simulator, the simulator performing transmission line simulation of the printed wiring board CAD processor.

3. The printed wiring board design aiding system according to claim 1, wherein the design layout information acquired by the means for acquiring design layout information includes one of design information for a pattern, design information for a through-hole, design information for a non-through-hole, design information for a via, and design information for the shape of the printed wiring board.

4. The printed wiring board design aiding system according to claim 1, wherein the setting parameter information acquired by the means for acquiring setting parameter information include a parameter of at least one of the thickness of the pattern, the thickness of an insulation material, a resin content of a prepreg, the viscosity of the prepreg, a resin flow amount of the prepreg, a stack time, a stack temperature, and a stack pressure.

5. A printed wiring board CAD system comprising:

a printed wiring board CAD processor;

a transmission line simulator; and a printed wiring board design aiding module which acquires information of a pattern of a printed wiring board to be designed and information of individual parameters of the thickness of the pattern, the thickness of an insulation material, a resin content of a prepreg, the viscosity of the prepreg, a resin flow amount of the prepreg, and stack conditions as the setting parameters from the printed wiring board CAD processor; and estimates either a value of a plate thickness of the printed wiring board or a value of the thickness of each of the insulation layers in accordance with the individual information; and feeds back an estimated value to the transmission line simulator.

6. A record medium having stored thereon a computer readable program for enabling a computer for causing a printed wiring board CAD processor to aid a printed wiring board design, said program comprising:

a code means for enabling a printed wiring board design aiding module to aid the printed wiring board design, including first code means for acquiring design layout information regarding a printed wiring board targeted for design from the printed wiring board CAD processor;

second code means for acquiring setting parameter information for the printed wiring board targeted for design;

third code means for estimating a value of the thickness of each of insulation layers of the printed wiring board in a post-manufacture state in accordance with the information acquired by the first code means and the information acquired by the second code means and which outputs an estimated value.

7. The record medium according to claim 6, said program further comprising fourth code means for performing feedback of information of the value estimated by the third code means to a simulator which performs transmission line simulation of the printed wiring board CAD processor.

8. The record medium according to claim 7, wherein the setting parameter information acquired by the second code means include a parameter of at least one of the thickness of the pattern, the thickness of an insulation material, a resin content of a prepreg, the viscosity of the prepreg, a resin flow amount of the prepreg, a stack time, a stack temperature, and a stack pressure.

9. The record medium according to claim 6, wherein the design layout information acquired by the first code means includes at least one of design information for a pattern, design information for a through-hole, design information for a non-through-hole, design information for a via, and design information for the shape of the printed wiring board.

10. The record medium according to claim 6, wherein the setting parameter information acquired by the second code means include a parameter of one of the thickness of the pattern, the thickness of an insulation material, a resin content of a prepreg, the viscosity of the prepreg, a resin flow amount of the prepreg, a stack time, a stack temperature, and a stack pressure.

11. The record medium according to claim 6, wherein the third code means estimates a permittivity of each of layers and a dielectric loss tangent thereof in accordance with the information of the estimated thickness of each of the insulation layers and prescribed information acquired by the first and second code means.

* * * * *